United States Patent [19]

Chung

[11] Patent Number: 5,976,394
[45] Date of Patent: Nov. 2, 1999

[54] METHOD FOR DRY-ETCHING A PLATINUM THIN FILM

[75] Inventor: Chee-won Chung, Yongin, Rep. of Korea

[73] Assignee: Samsung Electronics Co., Ltd., Kyungki-do, Rep. of Korea

[21] Appl. No.: 08/842,828

[22] Filed: Apr. 17, 1997

[30] Foreign Application Priority Data

Jul. 17, 1996 [KR] Rep. of Korea .................. 96-11613

[51] Int. Cl.⁶ .................................................. H01L 21/3065
[52] U.S. Cl. .................................................. 216/67; 216/75
[58] Field of Search ........................ 216/67, 75; 438/240, 438/253, 396

[56] References Cited

U.S. PATENT DOCUMENTS 4,135,998  1/1979  Gniewek et al. .................. 204/192
5,854,104  12/1998  Onishi et al. .................. 438/240

FOREIGN PATENT DOCUMENTS 62-92323  4/1987  Japan .................. 216/75

*Primary Examiner*—Bruce Breneman
*Assistant Examiner*—Anita Alanko
*Attorney, Agent, or Firm*—Foley & Lardner

[57] ABSTRACT

A method for dry etching a metallic thin film (i.e., platinum thin film) is disclosed whereby a clean metallic thin film can be formed by restraining redeposition of the metal. The etching gas includes a mixed gas including $Cl_2$ and $SiCl_4$ whereby a plasma of the mixed gas generates reactive species to react with the metallic thin film and form volatile residua that can be desorbed from the etched surface.

19 Claims, 3 Drawing Sheets

METHOD FOR DRY-ETCHING A PLATINUM THIN FILM

BACKGROUND OF THE INVENTION

1. Field of the Invention

The present invention relates to a method for etching a platinum thin film, and more particularly, to a method for dry-etching a platinum thin film whereby a clean platinum thin film can be formed by restraining redeposition of platinum.

2. Description of Related Art

Platinum thin films usually are used for forming an electrode of a thin film form for a ferroelectric capacitor as a device constituting a non-volatile random access memory or a dynamic random access memory. Here, a process for etching the platinum thin film is required to pattern the platinum thin film to form an electrode of the ferroelectric capacitor. In this etching processes, a dry etching method and a wet etching method are mainly used. The wet etching method is inconvenient because it is usually performed at a high temperature of over 60° C., and, in particular, is inadequate for forming a finely-patterned platinum thin film for an electrode necessary for a highly-integrated memory for high record density. Therefore, the dry etching method is generally used to etch the platinum thin film for electrode.

Because it is difficult to etch platinum due to its characteristics of low reactivity with a general gas, it is known to use the dry etching method whereby the platinum thin film is etched using a species such as a radical, an ion, or an electron which are reactive within plasma produced by using an inert gas such as Ar, He, etc. and a reactive gas. In such a dry etching method, Ar gas or a mixed gas such as $Cl_2/Ar$, $C_2F_6/Ar$ or $Cl_2/C_2F_6/Ar$ is widely used. As for the Ar gas and the $C_2F_6/Ar$ mixed gas, they do not make a reaction by-product through reaction with platinum, and the platinum therefore usually is etched through sputtering using Ar. Accordingly, the sputtered platinum is redeposited on the side surface of a photoresist starting from the side surface of the platinum thin film being etched, as shown in FIG. 1.

Referring now to FIG. 1, reference numeral 1 is a substrate, reference numeral 2 is a platinum pattern which is formed by an etching process, reference numeral 3 is a photoresist which is used during the etching process in order to form the platinum pattern 2, and reference numeral 4 is a platinum thin film redeposited during the etching. The reason why the unnecessary platinum thin film 4 is formed is because some by-product materials produced by the reaction of the $Cl_2/Ar$ and $Cl_2/C_2F_6/Ar$ mixed gases with platinum are not completely vaporized due to their high evaporation temperature. Consequently, a portion thereof is redeposited on the side surface of the platinum thin film starting from the surface of the photoresist.

As described above, the platinum thin film 4 of the prior art that is redeposited during formation of the electrode for the ferroelectric capacitor is connected to upper electrodes thus short-circuiting the capacitor. Also, other various problems may occur during deposition of an insulating layer after the platinum etching process or during the etching process for realizing a fine pattern. Thus, there exists a need to provide a dry etching process that does not result in or restrains or prevents redeposition of a platinum thin film during the etching process.

SUMMARY OF THE INVENTION

It is therefore an object of the present invention to provide a method for dry-etching a platinum thin film whereby a desirable precise pattern can be obtained by restraining redeposition of platinum during an etching process. It also is an object of the present invention to provide an etched film prepared by a method for dry-etching a platinum thin film whereby a desirable precise pattern can be obtained by restraining redeposition of platinum during an etching process.

To accomplish these and other objects of the present invention, there is provided a method for dry-etching a platinum thin film including etching a platinum thin film to form a desired pattern using a mixed gas including $Cl_2$ and $SiCl_4$ as an etching gas, thereby restraining redeposition of platinum. To accomplish additional objects of the present invention, there is provided an etched film prepared by a method for dry-etching a platinum thin film including etching a platinum thin film to form a desired pattern using a mixed gas including $Cl_2$ and $SiCl_4$ as an etching gas, thereby restraining redeposition of platinum. The above objects and advantages of the present invention will become more apparent by describing in detail a preferred embodiment thereof with reference to the attached drawings.

DETAILED DESCRIPTION OF THE PREFERRED EMBODIMENTS

Figure 2:
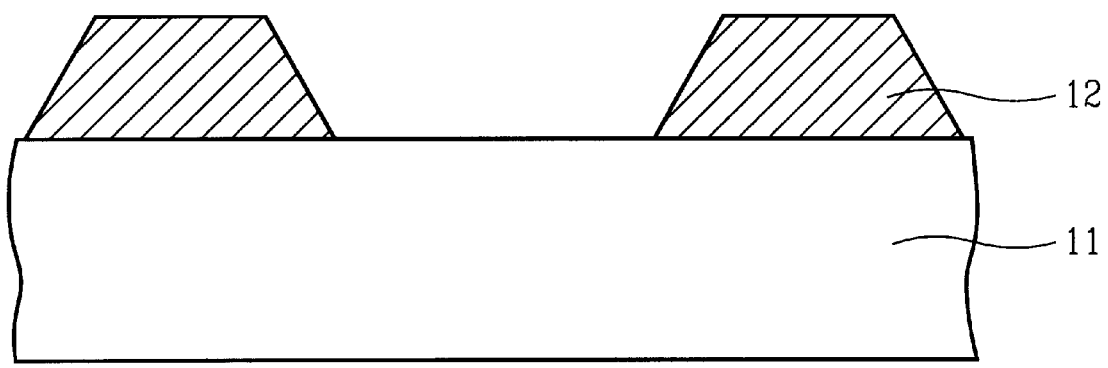
FIG. 2 is a sectional view of a platinum thin film formed by a dry-etching method according to the present invention.
Figure 3:
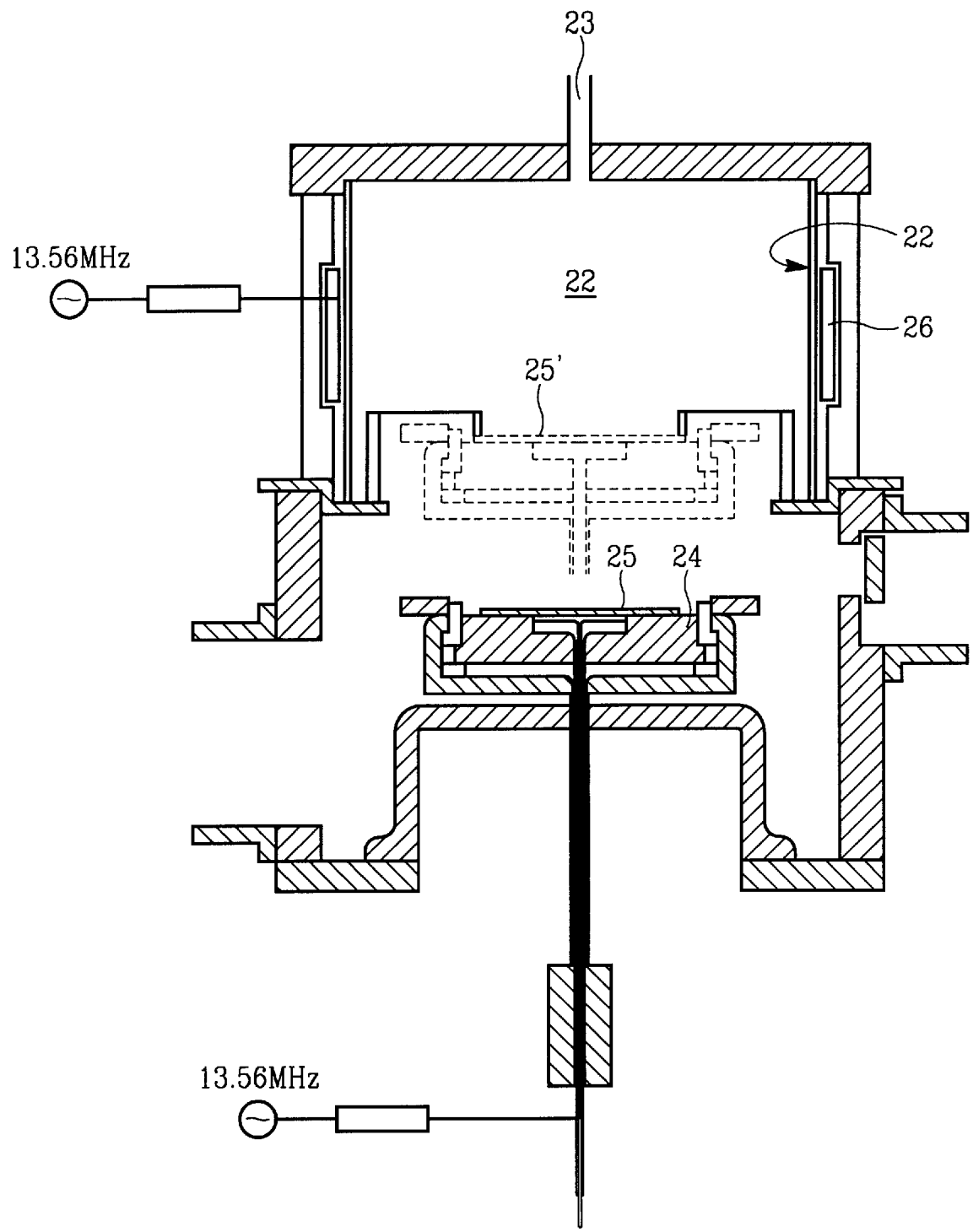
FIG. 3 is an schematic sectional view of an etching apparatus for conducting the dry-etching method according to the present invention.

A method for dry etching a platinum thin film according to the present invention is characterized by preventing redeposition of platinum by heightening the volatility of a reaction by-product produced during the etching process which contains portions of the etched platinum thin film. The reaction by-product volatility is enhanced by using a mixed gas of $Cl_2$ and $SiCl_4$ as an etching gas. When an etching process is performed according to the above-described method, a clean platinum thin film 12 can be formed in a desired pattern on a substrate 11, as shown in FIG. 2. The method for forming the clean platinum thin film for a ferroelectric capacitor electrode will be described with reference to a schematic sectional view of a multiplex ICP (inductively coupled plasma) system shown in FIG. 3. Other apparatus capable of forming a thin film of platinum can also be used and are readily apparent to those skilled in the art.

Figure 4:
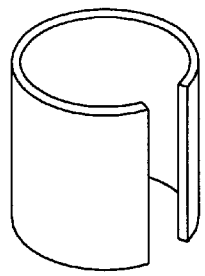
FIG. 4 is an extracted perspective view of a ring-shaped electrode in the etching apparatus shown in FIG. 3.

The multiplex ICP system usually includes a ceramic body 22 for forming a cylindrical-shaped plasma process chamber 21. The upper portion of the body 22 is sealed except through the center thereof which is provided with a gas inlet 23. A ring-shaped electrode 26 as shown in FIG. 4 is situated around the cylindrical body 22 such that a high-frequency (RF) power for plasma formation thereto can be applied thereto. A substrate lifter 24 is installed under the opened lower portion of the ceramic body 22. Here, the substrate lifter 24 is mounted with a substrate 25 thereon and moves up and down for an etching process.

A process for etching a platinum thin film using the above-structured multiplex ICP system is as follows. First, the substrate 25 on which the platinum thin film is to be formed is mounted on the substrate lifter 24 and lifted to a position 25' indicated by the dotted lines of FIG. 3 by the substrate lifter 24. Next, a high-frequency voltage (RF power) is applied to the ring-shaped electrode 26 disposed around the ceramic body 22 and a $Cl_2/SiCl_4$ mixed gas injected through the gas inlet 23 is transformed into a plasma state, thereby allowing the etching process to be performed. At this time, $SiCl_4$ is injected at a rate of about 7.5 cc/min and $Cl_2$ is injected at about 22.5 cc/min so that the volume ratio of the $SiCl_4$ and the $Cl_2$ is about 1 to 3, coil power applied to the ring-shaped electrode 26 is 600 watts, and platen power applied to the substrate 25 is 400 watts. The gas pressure inside the chamber 21 is maintained at 1 mTorr. Those skilled in the art recognize that the rate and ratio of gas input, coil power and platen power can be varied to provide an etched thin film of platinum. The skilled artisan also recognizes that metallic thin films other than platinum can be etched in accordance with the invention, such as aluminum, platinum silicide, silicon dioxide, silicon nitride, and the like.

Figure 5:
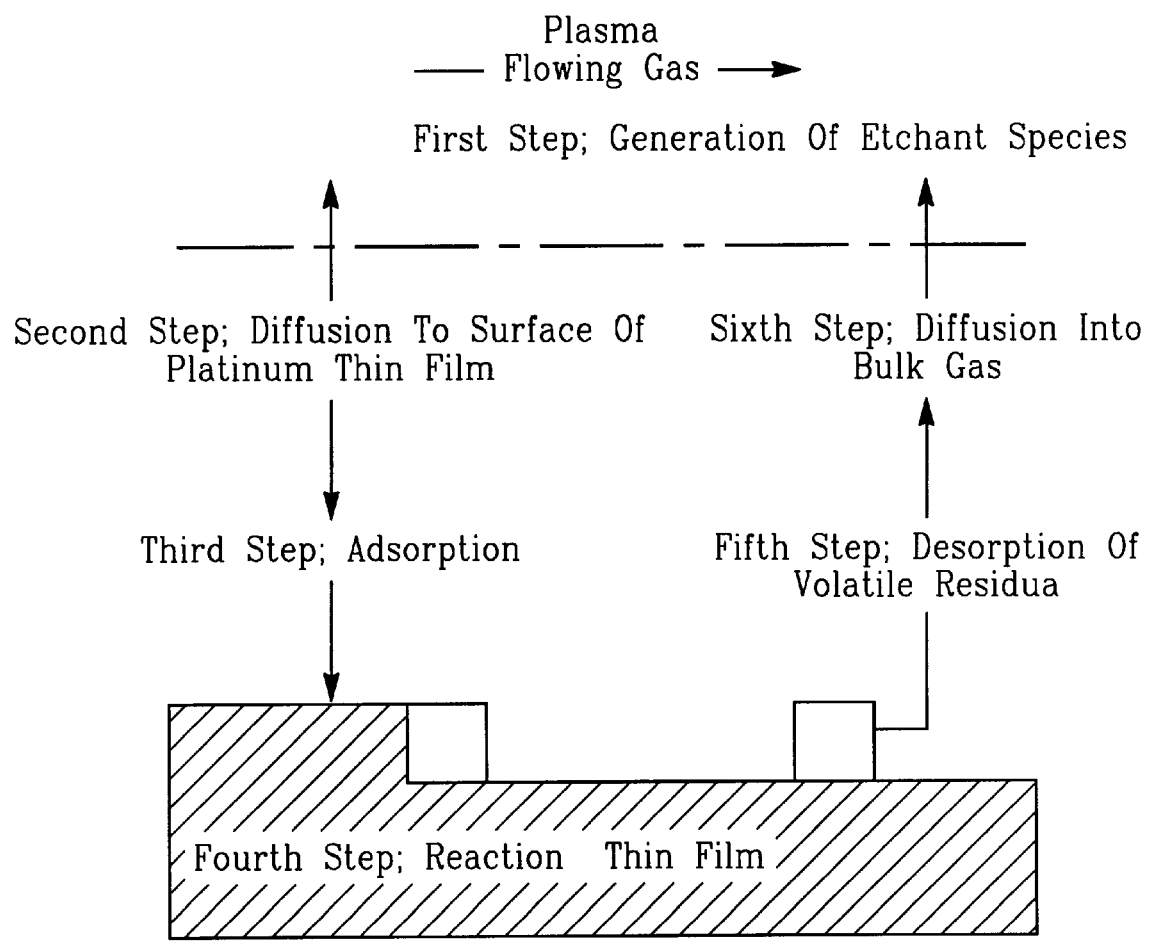
FIG. 5 illustrates an etching process in a plasma etching method.

When the etching process is conducted under the above-described process conditions, the etching is realized through the steps shown in FIG. 5. In a first step, reactive chemical species such as radicals, ions and electrons are generated in a plasma of the $Cl_2/SiCl_4$ mixed gas. In a second step, the reactive species are diffused into the surface of a material to be etched, i.e., the platinum thin film. Then, the chemical species are adsorbed on the surface of the platinum thin film, in a third step. In a fourth step, volatile residua are formed on the platinum thin film through a chemical reaction. In a fifth step, the volatile residua are desorbed from the surface of the platinum thin film. Then, in a sixth step, the desorbed volatile residua are diffused into a bulk gas and removed from the system.

If any one of the six steps is not performed, the complete etching cycle is not fully realized. In the process, the desorption of the residua is an important step. The reactive species can react with a solid surface (the surface of platinum). However, if the residua so formed do not have a proper amount of vapor pressure which can permit desorption of the residua after an etching reaction occurs on the solid surface, the reactive residua are not desorbed and hence, are redeposited on the side surface of the thin film. The first, second and sixth steps include a reaction which occurs in a vapor and plasma state. On the other hand, the third, fourth and fifth steps are performed on the surface of the solid (platinum) layer which is etched.

Figure 1:
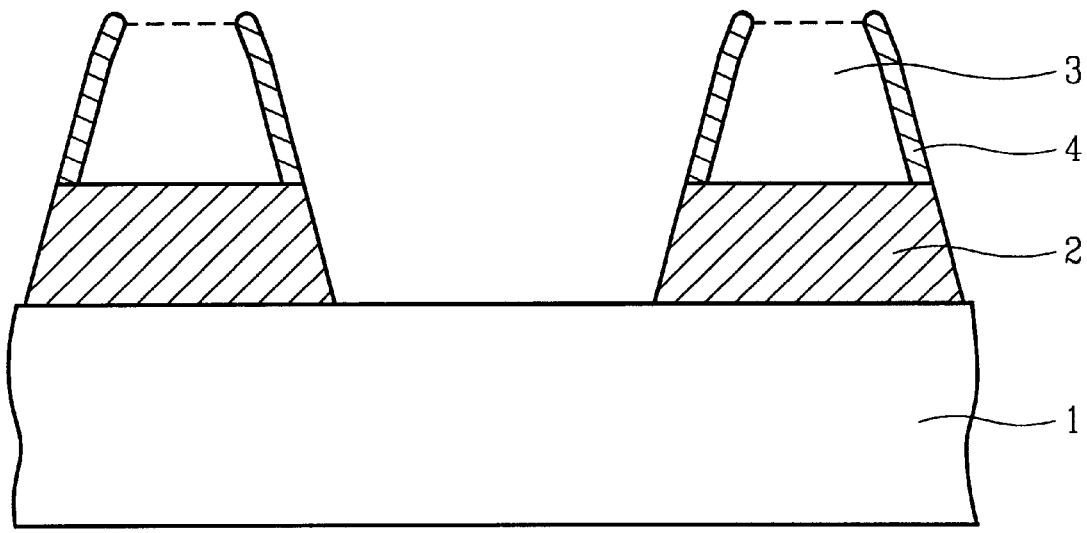
FIG. 1 is a sectional view of a platinum thin film formed by a conventional dry-etching method.

In a platinum thin film etching process including the six-step etching process described above, when a $Cl_2/SiCl_4/Ar$ mixed gas is used as a gas for etching platinum including a $Cl_2/SiCl_4$ mixed gas, it was observed that the amount of redeposited platinum 4 that typically occurs in prior art methods, (shown in FIG. 1), is drastically reduced compared to when a conventional $Cl_2/Ar$ mixed gas is used. Meanwhile, when a $Cl_2/SiCl_4$ mixed gas, exclusive of Ar from $Cl_2/SiCl_4$, is used, redeposition of platinum is not observed at all. While not intending on being bound by any theory, the inventor believes that the reason why such a result is generated is that, when Ar is used as an etching gas, Ar is excited to a relatively strong energy state and collides with the surface of platinum (i.e., a sputtering effect) thereby damaging the surface of the platinum. The use of Ar also can result in etching the platinum or weakening a combination of the platinum, so that the $Cl_2$ and the $SiCl_4$ chemical gases are easily reacted with the platinum, but the platinum sputtered by the Ar is not completely vaporized in the etching chamber and consequently, is redeposited on the side surface of the platinum including a photoresist 3 (see FIG. 1).

In the dry (plasma) etching method according to the present invention, the $Cl_2$ and $SiCl_4$ gases are used as an etching gas such that reaction residua produced by the reaction of platinum with reactive species formed in a plasma state can be rediffused into a plasma gas. Therefore, redeposition of the platinum does not occur, thus forming a platinum thin film having a clean pattern.

Those skilled in the art will appreciate that various modifications can be made to the present invention. For example, the method of etching a thin platinum film need not necessarily include all of the aforementioned six steps. Rather, two or more steps may be combined into one step, or additional procedures may be carried out, so long as the method prevents the redeposition of platinum. That is, a variety of methods are encompassed by the present invention whereby a metallic thin film is etched using a mixed gas plasma that generates reactive chemical species that, when reacted with the metallic thin film generate reaction by-products that are volatile, and hence, can be removed or desorbed from the etched surface after the platinum is etched. The process of the present invention therefore substantially reduces and/or prevents entirely redeposition of platinum after etching.

Persons skilled in the art recognize that various modifications can be made to the present invention without departing from the spirit and scope thereof.

What is claimed is:

1. A method of dry etching a metallic thin film comprising:
   contacting in a reaction chamber a substrate having a metallic thin film deposited thereon with an etching gas comprising a mixture of $Cl_2$ and $SiCl_4$ to etch a desired pattern in the metallic thin film;
   desorbing volatile residua produced during the contacting step above from the substrate; and
   removing the substrate having a metallic thin film deposited thereon from the reaction chamber,
   wherein portions of the metallic thin film removed during the contacting step are not redeposited.

2. The method as claimed in claim 1, wherein the metallic thin film is a platinum thin film.

3. The method as claimed in claim 1, wherein during the contacting step reactive chemical species selected from the group consisting of radicals, ions and electrons are generated in a plasma of the etching gas, the chemical species are diffused into and adsorbed on the surface of the metallic thin film, and volatile residua are formed on the metallic thin film through a chemical reaction.

4. The method as claimed in claim 1, further comprising diffusing the desorbed volatile residua into a bulk gas and removing the bulk gas from the reaction chamber.

5. The method as claimed in claim 1, wherein the etching gas comprises a mixture of $SiCl_4$ and $Cl_2$ in a volume ratio of about 1 to 3.

6. The method as claimed in claim 1, wherein $SiCl_4$ gas is supplied to the reaction chamber at a rate of about 7.5 cc/min, and $Cl_2$ gas is supplied to the reaction chamber at a rate of about 22.5 cc/min.

7. The method as claimed in claim 1, wherein the air pressure in the reaction chamber is about 1 mTorr.

8. The method as claimed in claim 1, wherein platen power of about 400 watts is supplied to the substrate during the contacting step.

9. The method as claimed in claim 1, wherein coil power of about 600 watts is supplied to the reaction chamber during the contacting step.

10. A method of dry etching a metallic thin film comprising:

supplying an etching gas comprising a mixture of $Cl_2$ and $SiCl_4$ to a reaction chamber;

generating reactive chemical species selected from the group consisting of radicals, ions and electrons in a plasma of the $Cl_2/SiCl_4$ gas mixture;

contacting in the reaction chamber a substrate having a metallic thin film deposited thereon with the plasma of the $Cl_2/SiCl_4$ gas mixture containing the reactive chemical species whereby the reactive chemical species are diffused into a surface of the metallic thin film and a desired pattern is etched in the metallic thin film;

adsorbing the reactive chemical species on the surface of the metallic thin film;

forming volatile residua on the metallic thin film surface through a chemical reaction between the metallic thin film and the reactive chemical species;

desorbing the volatile residua formed on the metallic thin film surface; and diffusing the desorbed volatile residua into a bulk gas.

11. The method as claimed in claim 10, further comprising removing the bulk gas and the etched substrate from the reaction chamber.

12. The method as claimed in claim 10, wherein the metallic thin film is a platinum thin film.

13. The method as claimed in claim 10, wherein the etching gas comprises a mixture of $SiCl_4$ and $Cl_2$ in a volume ratio of about 1 to 3.

14. The method as claimed in claim 10, wherein $SiCl_4$ gas is supplied to the reaction chamber at a rate of about 7.5 cc/min, and $Cl_2$ gas is supplied to the reaction chamber at a rate of about 22.5 cc/min.

15. The method as claimed in claim 10, wherein the air pressure in the reaction chamber is about 1 mTorr.

16. The method as claimed in claim 10, wherein platen power of about 400 watts is supplied to the substrate in the reaction chamber.

17. The method as claimed in claim 10, wherein coil power of about 600 watts is supplied to the reaction chamber.

18. A substrate comprising an etched metallic thin film, wherein the substrate is prepared by a method according to claim 1.

19. A substrate comprising an etched metallic thin film, wherein the substrate is prepared by a method according to claim 10.

* * * * *